United States Patent
Ka

(10) Patent No.: US 10,553,256 B2
(45) Date of Patent: Feb. 4, 2020

(54) SEMICONDUCTOR DEVICE

(71) Applicant: SK hynix Inc., Icheon-si, Gyeonggi-do (KR)

(72) Inventor: Dong Yoon Ka, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/213,796

(22) Filed: Dec. 7, 2018

(65) Prior Publication Data

US 2019/0333547 A1     Oct. 31, 2019

(30) Foreign Application Priority Data

Apr. 30, 2018   (KR) .................. 10-2018-0050147

(51) Int. Cl.
| | | |
|---|---|---|
| G11C 5/06 | (2006.01) | |
| G11C 11/40 | (2006.01) | |
| G11C 7/18 | (2006.01) | |
| G11C 8/10 | (2006.01) | |
| G11C 5/02 | (2006.01) | |

(52) U.S. Cl.
CPC ............. *G11C 5/063* (2013.01); *G11C 5/025* (2013.01); *G11C 7/18* (2013.01); *G11C 8/10* (2013.01); *G11C 11/40* (2013.01)

(58) Field of Classification Search
None
See application file for complete search history.

(56) References Cited

U.S. PATENT DOCUMENTS

| | | | |
|---|---|---|---|
| 7,738,311 B2 | 6/2010 | Youn et al. | |
| 2008/0112251 A1 | 5/2008 | Youn et al. | |
| 2010/0014367 A1* | 1/2010 | Wang ..................... | G11C 8/16 |
| | | | 365/200 |
| 2019/0214078 A1* | 7/2019 | Kim .................. | G11C 13/0026 |

FOREIGN PATENT DOCUMENTS

KR           100855586 B1     9/2008

* cited by examiner

*Primary Examiner* — Tan T. Nguyen
(74) *Attorney, Agent, or Firm* — William Park & Associates Ltd.

(57) ABSTRACT

A semiconductor device may include a first column decoder arranged at a first side of a bank, wherein the first column decoder is enabled by a first column decoder select signal. The semiconductor device may include a second column decoder arranged at a second side of the bank, wherein the second column decoder is enabled by a second column decoder select signal; and wherein the bank is arranged between the first column decoder and the second column decoder. The semiconductor device may further include a column decoder selection circuit suitable for activating any one of the first and second column decoder select signals based on a row address.

20 Claims, 7 Drawing Sheets

SEMICONDUCTOR DEVICE

CROSS-REFERENCES TO RELATED APPLICATION

The present application claims priority under 35 U.S.C. § 119(a) to Korean application number 10-2018-0050147, filed on Apr. 30, 2018, in the Korean Intellectual Property Office, which is incorporated herein by reference in its entirety.

BACKGROUND

1. Technical Field

Various embodiments generally relate to a semiconductor device, and more particularly, to a technique relating to reducing a signal transmission path.

2. Related Art

With the increasing demand for high-capacity memory, semiconductor devices including more memory cells per unit area are being manufactured. In order to increase memory cell density, the height of a bank in which memory cells are arranged is increased. However, this increase in height lengthens a transmission path of a signal for accessing a memory cell corresponding to a specific word line and a specific bit line of the bank. This results in an increase of a column-to-column delay (CCD), which degrades the performance of the semiconductor device.

SUMMARY

For an embodiment in accordance with the present teachings, a semiconductor device may include a first column decoder arranged at a first side of a bank, wherein the first column decoder is enabled by a first column decoder select signal. The semiconductor device may include a second column decoder arranged at a second side of the bank, wherein the second column decoder is enabled by a second column decoder select signal, and wherein the bank is arranged between the first column decoder and the second column decoder. The semiconductor device may further include a column decoder selection circuit suitable for activating any one of the first and second column decoder select signals based on a row address.

For another embodiment in accordance with the present teachings, a semiconductor device may include a column decoder selection circuit suitable for activating any one of first column decoder select signal and a second column decoder select signal based on a row address. The semiconductor device may also include a first column decoder suitable for decoding a column address based on the first column decoder select signal and for outputting a first column select signal to a first column select signal transmission line based on the decoding result of the column address. The semiconductor device may also include a second column decoder suitable for decoding the column address based on the second column decoder select signal and for outputting a second column select signal to a second column select signal transmission line based on the decoding result of the column address. The semiconductor device may additionally include a bank including a plurality of cells coupled to a plurality of word lines and a plurality of bit lines, wherein cells of the plurality of cells in an upper region of the bank are accessed in response to a first column select signal transmitted through the first column select signal transmission line, and wherein cells of the plurality of cells in a lower region of the bank are accessed in response to a second column select signal transmitted through the second column select signal transmission line.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

Hereinafter, a semiconductor device according to the present disclosure will be described below with reference to the accompanying drawings through exemplary embodiments. Various embodiments are directed to a semiconductor device which can reduce a transmission path of a signal, thereby improving the integration density of memory cells.

Figure 1:
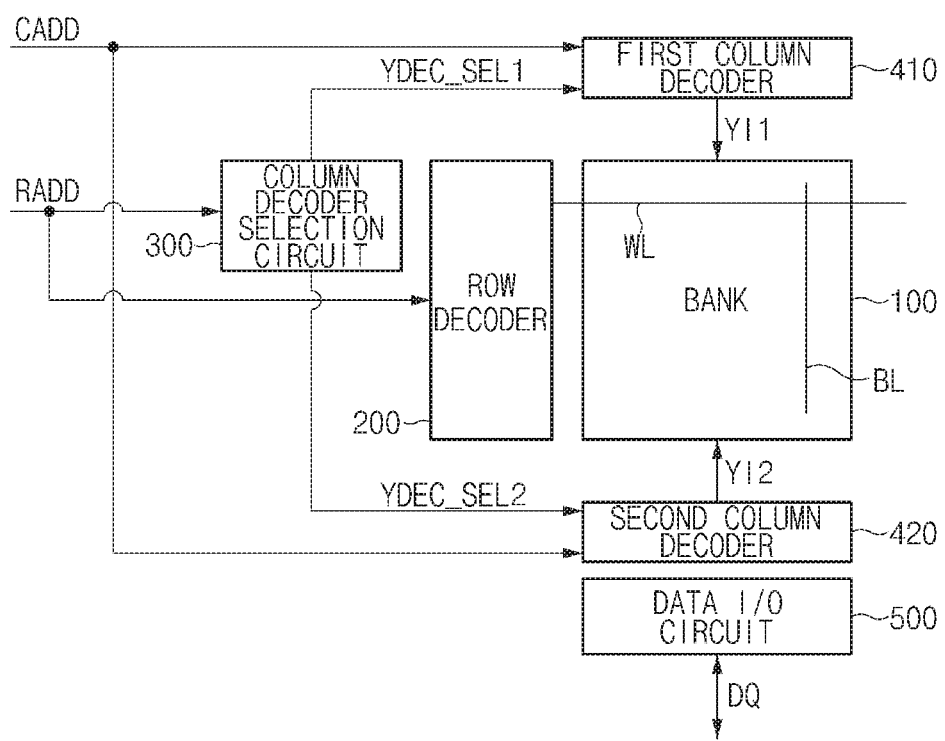
FIG. 1 shows a configuration diagram of a semiconductor device, in accordance with an embodiment of the present teachings.

FIG. 1 shows a configuration diagram of a semiconductor device 1, in accordance with an embodiment of the present teachings.

The semiconductor device 1 may include a bank 100, a row decoder 200, a column decoder selection circuit 300, a first column decoder 410, a second column decoder 420, and a data input/output (I/O) circuit 500.

The bank 100 may include a plurality of memory cells coupled to a plurality of word lines WL and a plurality of bit lines BL. The present embodiment may be based on the supposition that the word lines WL extend in a horizontal direction, and the bit lines BL extend in a vertical direction. A detailed configuration of the bank 100 is described in detail with reference to FIG. 2.

The row decoder 200 may enable one or more word lines WL based on a result obtained by decoding a row address RADD.

The column decoder selection circuit 300 may selectively enable any one of the first and second column decoders 410 and 420 based on the row address RADD. For example, the column decoder selection circuit 300 may activate any one of first and second column decoder select signals YDEC_SEL1 and YDEC_SEL2 according to the row address RADD.

The column decoder selection circuit 300 may select any one of the first and second column decoders 410 and 420 based on the value of the most significant bit (MSB) of the row address RADD. For example, the column decoder selection circuit 300 may select the first column decoder 410 when the value of the MSB of the row address RADD is '0.' On the other hand, the column decoder selection circuit 300 may select the second column decoder 420 when the value of the MSB of the row address RADD is '1.'

The first column decoder 410 may be arranged at one side of the bank 100, and the second column decoder 420 may be arranged so as to face the first column decoder 410 from the other side of the bank 100. The bank 100, for instance, is interposed between the first and second column decoders 410 and 420 as illustrated. In an embodiment, the first and second column decoders 410 and 420 may be arranged along the direction in which the bit lines BL extend.

The first column decoder 410 may decode a column address CADD based on the first column decoder select signal YDEC_SEL1 and may output a first column select signal YI1 to the bank 100 according to the decoding result. The second column decoder 420 may decode the column address CADD based on the second column decoder select signal YDEC_SEL2 and may output a second column select signal YI2 to the bank 100 according to the decoding result. Because only one signal of the first and second column decoder select signals YDEC_SEL1 and YDEC_SEL2 is activated, only one of the first and second column decoders 410 and 420 is operated.

The data I/O circuit 500 may output data DQ from the bank 100 to the outside during a read operation or may input data DQ from the outside to the bank 100 during a write operation. The data I/O circuit 500 may be arranged adjacent to the second column decoder 420 for an embodiment.

Figure 2:
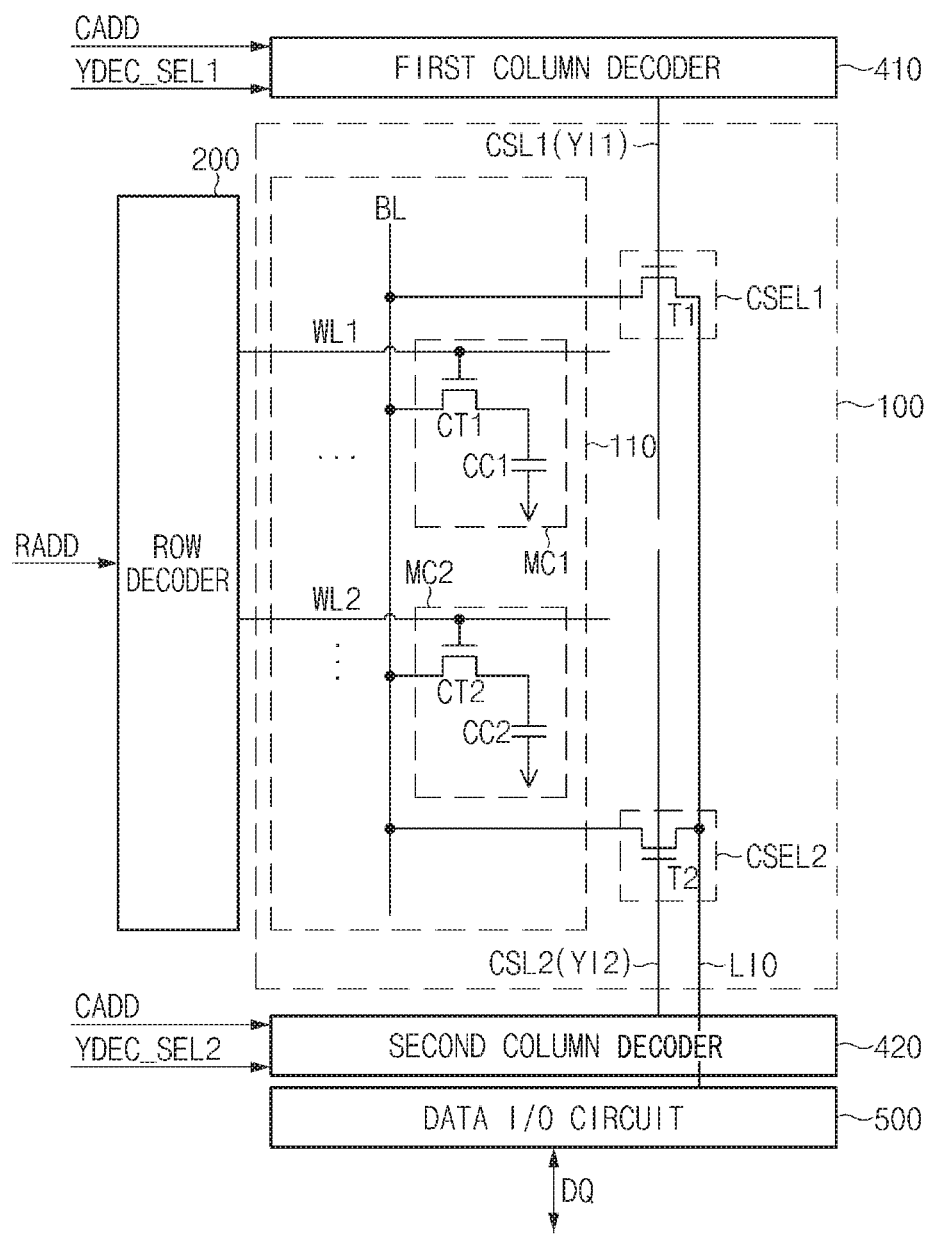
FIG. 2 shows a detailed diagram of the bank of FIG. 1.

FIG. 2 shows a detailed diagram of the bank 100 of FIG. 1.

Referring to FIG. 2, the bank 100 may include a memory cell array 110 and a plurality of column selection circuits CSEL1 and CSEL2.

The memory cell array 110 may include a plurality of word lines WL1 and WL2 and a plurality of bit lines BL. FIG. 2 illustrates two word lines WL1 and WL2 and one bit line BL, for convenience of description. The word line WL1 may be positioned at an upper region of the memory cell array 110, and the word line WL2 may be positioned at a lower region of the memory cell array 110.

The memory cell array 110 may include a plurality of cells MC1 and MC2 arranged at the respective intersections between the plurality of word lines WL1 and WL2 and the plurality of bit lines BL. FIG. 2 illustrates only two cells MC1 and MC2. The cell MC1 may be coupled to the word line WL1 and the bit line BL, and the cell MC2 may be coupled to the word line WL2 and the bit line BL. The cell MC1 may include a cell transistor CT1 and a cell capacitor CC1. The cell MC2 may include a cell transistor CT2 and a cell capacitor CC2.

The column selection circuits CSEL1 and CSEL2 may correspond to the respective cells MC1 and MC2.

The column selection circuit CSEL1 may transfer data of the bit line BL to a data I/O line LIO in response to the first column select signal YI1. The column selection circuit CSEL1 may include a transistor T1. The transistor T1 may be coupled between the bit line BL and the data I/O line LIO, and may receive the first column select signal YI1 through its gate terminal. The first column select signal YI1 may be applied through a first column select signal transmission line CSL1.

The column selection circuit CSEL2 may transfer the data of the bit line BL to the data I/O line LIO in response to the second column select signal YI2. The column selection circuit CSEL2 may include a transistor T2. The transistor T2 may be coupled between the bit line BL and the data I/O line LIO, and may receive the second column select signal YI2 through its gate terminal. The second column select signal YI2 may be applied through a second column select signal transmission line CSL2.

The first column decoder 410 may be arranged at the top of the bank 100, and the second column decoder 420 may be arranged at the bottom of the bank 100.

The bank 100 may use different column decoders depending on accessed regions. In other words, when a cell positioned in an upper region of the bank 100 is accessed, the first column decoder 410 may be used, and when a cell positioned in a lower region of the bank 100 is accessed, the second column decoder 420 may be used.

The bank 100 in accordance with the present embodiment may include one data I/O line LIO and two column select signal transmission lines corresponding to the bit line BL. The two column select signal transmission lines may include first and second column select signal transmission lines CSL1 and CSL2. FIG. 2 illustrates only one bit line BL. However, when a plurality of bit lines BL are installed, two column select signal transmission lines, i.e. the first and second column select signal transmission lines CSL1 and CSL2, may be coupled to each of the bit lines BL.

That is, the first column select signal transmission line CSL1 may be coupled to the first column decoder 410. Therefore, when the column selection circuit CSEL1 is operated by the first column select signal YI1, data of the cell MC1 arranged in the upper region of the memory cell array 110 may be transferred to the data I/O line LIO through the bit line BL. The second column select signal transmission line CSL1 may be coupled to the second column decoder 420.

Therefore, when the column selection circuit CSEL2 is operated by the second column select signal YI2, data of the cell MC2 arranged in the lower region of the memory cell array 110 may be transferred to the data I/O line LIO through the bit line BL. The data DQ transferred to the data I/O line LIO may be outputted to the outside through the data I/O circuit 500.

For an embodiment, the semiconductor device 1 having the above-described configuration may operate as follows.

First, a read operation when the most significant bit MSB of the row address RADD is '0' is described.

The row decoder 200 may enable one or more of the plurality of word lines WL according to a result obtained by decoding the row address RADD. For example, suppose that the word line WL1 positioned in the upper region of the memory cell array 110 is enabled by the row decoder 200. When the word line WL1 is enabled, the cell transistor CT1 of the cell MC1 may be turned on. Therefore, as charge is shared between the bit line BL and the cell capacitor CC1, a voltage stored in the cell capacitor CC1 may be outputted to the bit line BL.

Because the MSB of the row address RADD is '0,' the first column decoder select signal YDEC_SEL1 may be activated. Thus, the first column decoder 410 may decode the column address CADD. The present embodiment may be based on the supposition that the first column decoder 410 transmits the first column select signal YI1 through the first column select signal transmission line CSL1. When the first column decoder 410 is selected, the transistor T1 of the first column selection circuit CSEL1 may be turned on to transmit the voltage of the bit line BL to the data I/O line LIO, according to the first column select signal YI1. The data I/O circuit 500 may output the data DQ applied from the data I/O line LIO to the outside.

Next, a read operation when the MSB of the row address RADD is '1' is described.

Suppose that the word line WL2 positioned in the lower region of the memory cell array 110 is enabled by the row decoder 200. When the word line WL2 is enabled, the cell transistor CT2 of the cell MC2 may be turned on. Therefore, as charge is shared between the bit line BL and the cell capacitor CC2, a voltage stored in the cell capacitor CC2 may be outputted to the bit line BL.

Because the MSB of the row address RADD is '1,' the second column decoder select signal YDEC_SEL2 may be activated. Thus, the second column decoder 420 may decode the column address CADD. The present embodiment may be based on the supposition that the second column decoder 420 transmits the second column select signal YI2 through the second column select signal transmission line CSL2. When the second column decoder 420 is selected, the transistor T2 of the second column selection circuit CSEL2 may be turned on to transmit the voltage of the bit line BL to the data I/O line LIO, according to the second column select signal YI2. The data I/O circuit 500 may output the data DQ applied from the data I/O line LIO to the outside.

Next, a write operation when the MSB of the row address RADD is '0' is described.

When the word line WL1 is enabled by the row decoder 200, the cell transistor CT1 may be turned on. The data I/O circuit 500 may transmit data DQ inputted from outside to the data I/O line LIO. Because the MSB of the row address RADD is '0,' the first column decoder select signal YDEC_SEL1 may be activated. Therefore, the first column decoder 410 may decode the column address CADD. When the first column decoder 410 is selected, the transistor T1 of the first column selection circuit CSEL1 may be turned on to transmit the voltage of the data I/O line LIO to the bit line BL, according to the first column select signal YI1. At this time, because the cell transistor CT1 is turned on, the cell capacitor CC1 may be charged by the potential of the bit line BL.

Finally, a write operation when the MSB of the row address RADD is '1' is described.

When the word line WL2 is enabled by the row decoder 200, the cell transistor CT2 may be turned on. The data I/O circuit 500 may transmit data DQ inputted from outside to the data I/O line LIO. Because the MSB of the row address RADD is '1,' the second column decoder select signal YDEC_SEL2 may be activated. Therefore, the second column decoder 420 may decode the column address CADD. When the second column decoder 420 is selected, the transistor T2 of the second column selection circuit CSEL2 may be turned on to transmit the voltage of the data I/O line LIO to the bit line BL, according to the second column select signal YI2. At this time, because the cell transistor CT2 is turned on, the cell capacitor CC2 may be charged by the potential of the bit line BL.

For some embodiments, the first and second column select signal transmission lines CSL1 and CSL2 may have a length corresponding to substantially half of the height of the bank 100. The present embodiment is based on the supposition that the word line WL1 belonging to the upper region of the bank 100 is enabled when the MSB of the row address RADD is '0,' and the word line WL2 belonging to the lower region of the bank 100 is enabled when the MSB of the row address RADD is '1.' However, other embodiments are not limited to these lengths. The lengths of the first and second column select signal transmission lines CSL1 and CSL2 may be changed within a range equal to or less than the height of the bank 100. In this case, the column decoder selection circuit 300 may enable any one of the first and second column decoder select signals YDEC_SEL1 and YDEC_SEL2, based on another bit of the row address RADD as well as based on the MSB of the row address RADD.

Figure 3:
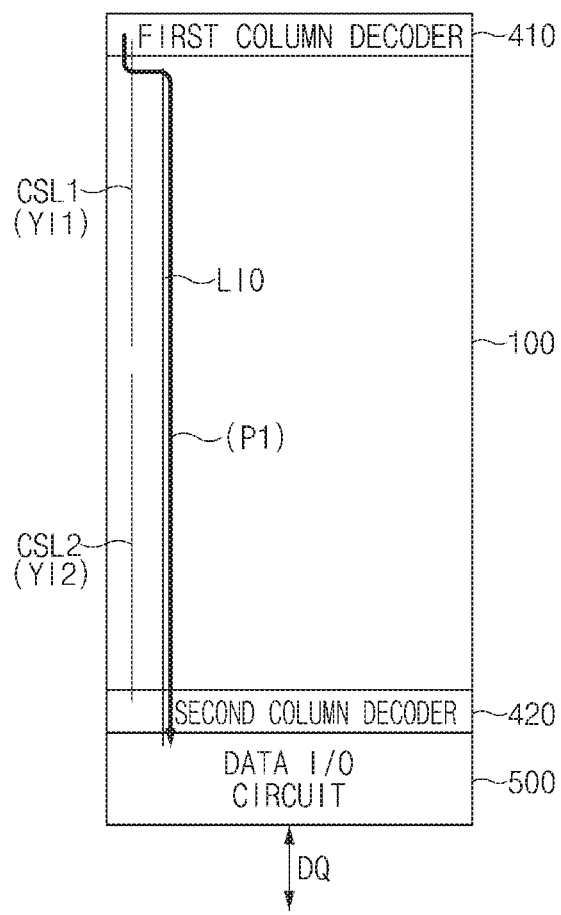
FIGS. 3, 4, and 5 show diagrams illustrating a transmission path of a column select signal in the semiconductor device of FIG. 1.

FIG. 3 illustrates a transmission path of the first column select signal YI1 in the semiconductor device 1 of FIG. 1. FIG. 3 illustrates only a part of the semiconductor device 1. FIG. 3 illustrates that a cell corresponding to an uppermost word line in the upper region of the bank 100 is accessed.

Referring to FIG. 3, the first column select signal YI1 generated through the first column decoder 410 may be transmitted to the cell corresponding to the uppermost word line of the bank 100 along the first column select signal transmission line CSL1. Therefore, the data DQ may be outputted from the cell to which the first column select signal YI1 is transmitted. The data DQ transmitted to the data I/O circuit 500 along the data I/O line LIO may be outputted to the outside.

In FIG. 3, an arrow P1 indicates transmission paths of the first column select signal YI1 and the data DQ. The first column select signal YI1 may be transmitted to the uppermost word line of the bank 100 from the first column decoder 410, and the data DQ may be transmitted from the top of the bank 100 to the data I/O circuit 500 positioned at the bottom of the bank 100. Therefore, the sum of the lengths of the transmission paths of the first column select signal YI1 and the data DQ may correspond to the height of the bank 100.

Figure 4:
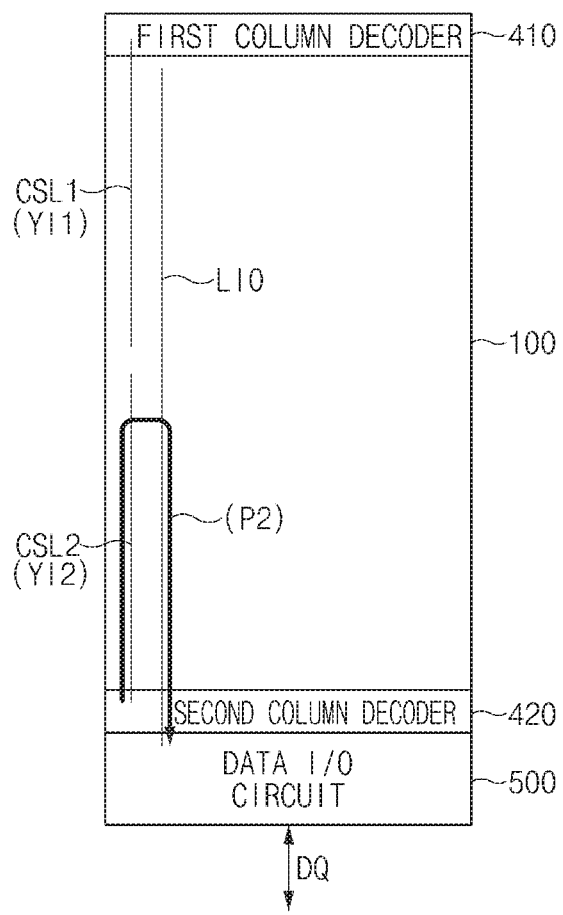

FIG. 4 illustrates a transmission path of the first column select signal YI1 in the semiconductor device 1 of FIG. 1. FIG. 4 illustrates only a part of the semiconductor device 1. FIG. 4 illustrates that a cell corresponding to an uppermost word line in the lower region of the bank 100 is accessed.

Referring to FIG. 4, the second column select signal YI2 generated through the second column decoder 420 may be transmitted to the cell corresponding to the uppermost word line in the lower region of the bank 100 along the second column select signal transmission line CSL2. Therefore, the data DQ may be outputted from the cell to which the second column select signal YI2 is transmitted. The data DQ transmitted to the data I/O circuit 500 along the data I/O line LIO may be outputted to the outside.

In FIG. 4, an arrow P2 indicates transmission paths of the second column select signal YI2 and the data DQ. The second column select signal YI2 may be transmitted along a path from the second column decoder 420 to the uppermost word line in the lower region of the bank 100, the path having a length corresponding to about half of the height of the bank 100. The data DQ may be transmitted along a path from the top of the lower region of the bank 100 to the data I/O circuit 500 positioned at the bottom of the bank 100, the path having a length corresponding to about half of the height of the bank 100. Therefore, the sum of the lengths of the transmission paths of the second column select signal YI2 and the data DQ may correspond to the height of the bank 100.

Figure 5:
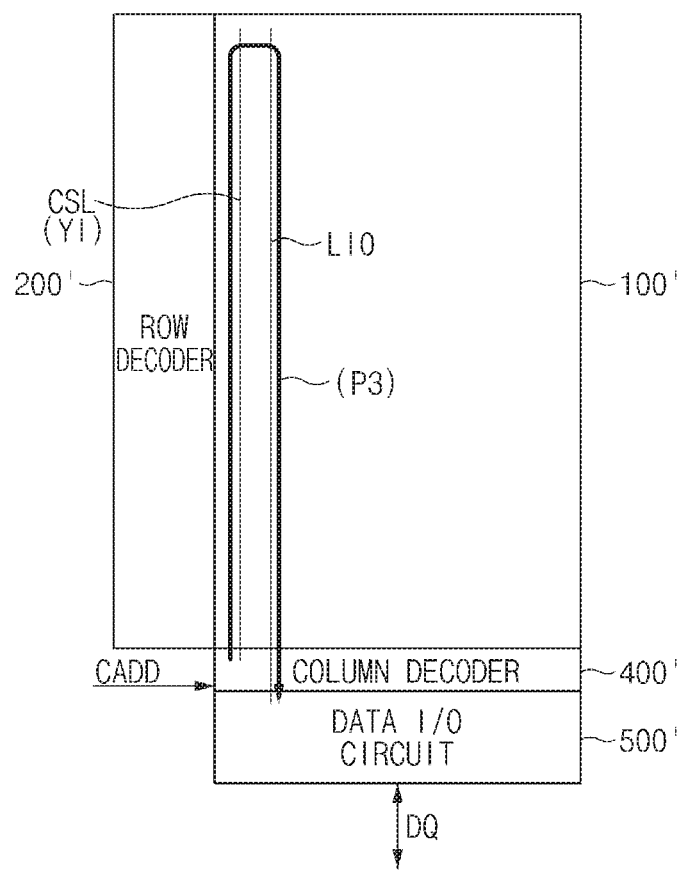

FIG. 5 illustrates a transmission path of the column select signal YI in a semiconductor device 1', in accordance with a comparative example.

Referring to FIG. 5, the semiconductor device 1' may include a bank 100', a row decoder 200', a column decoder 400' and a data I/O circuit 500'.

FIG. 5 is based on the supposition that a plurality of bit lines correspond to a plurality of column select signal transmission lines CSL and a plurality of data I/O lines LIO. That is, the bank 100' may include one column select transmission line CSL corresponding to one bit line, unlike for the bank 100 described with reference to FIGS. 3 and 4.

The semiconductor device 1' includes a single column decoder 400', and does not include the column decoder selection circuit 300 of the semiconductor device 1. The column decoder 400' decodes the column address CADD and transmits the column select signal YI through one or more of the plurality of column select signal transmission lines CSL, based on the decoding result.

Referring to FIG. 5, the column select signal YI generated through the column decoder 400' is transmitted to a cell corresponding to the uppermost word line of the bank 100' along the column select signal transmission line CSL. Therefore, the data DQ is outputted from the cell to which the column select signal YI is transmitted. The output data DQ is transmitted to the data I/O circuit 500' along the data I/O line LIO.

In FIG. 5, an arrow P3 indicates transmission paths of the column select signal YI and the data DQ. The column select signal YI is transmitted along a path from the column decoder 400' to the top of the bank 100', the path having a length corresponding to the height of the bank 100'. The data DQ may be transmitted along a path from the top of the bank 100' to the data I/O circuit 500' under the bank 100', the path having a length corresponding to the height of the bank 100'.

The cases of FIGS. 3 and 5, in which the uppermost word lines of the banks 100 and 100', respectively, are accessed, may be compared as follows. In the case of FIG. 3, the sum of the lengths of the transmission paths of the column select signal YI and the data DQ may correspond to the height of the bank. In the case of FIG. 5, the sum of the lengths of the transmission paths of the column select signal YI and the data DQ correspond to the double of the height of the bank. FIGS. 3 and 5 illustrate that the uppermost word lines of the banks 100 and 100' are accessed. However, even when the upper region of the bank is accessed, a transmission path of the semiconductor device 1, in accordance with the present teachings, may be shorter than a transmission path of the semiconductor device 1', in accordance with the comparative example.

Because the present embodiment is based on the supposition that the data I/O circuit 500 is positioned at the bottom of the bank 100, the transmission path of a signal can be reduced when the upper region of the bank is accessed by the first column decoder 410. On the other hand, when the data I/O circuit 500 is positioned at the top of the bank 100, the transmission path of a signal can be reduced in the case where the lower region of the bank is accessed by the second column decoder 420.

Figure 6A:
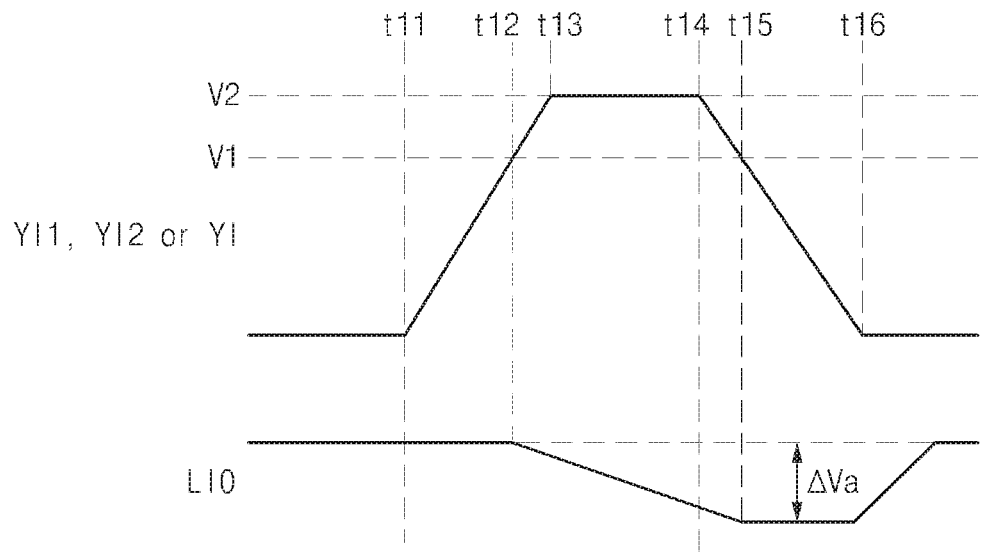
FIGS. 6A and 6B show diagrams illustrating the pulse shape of the column select signal in the semiconductor device of FIG. 1.
Figure 6B:
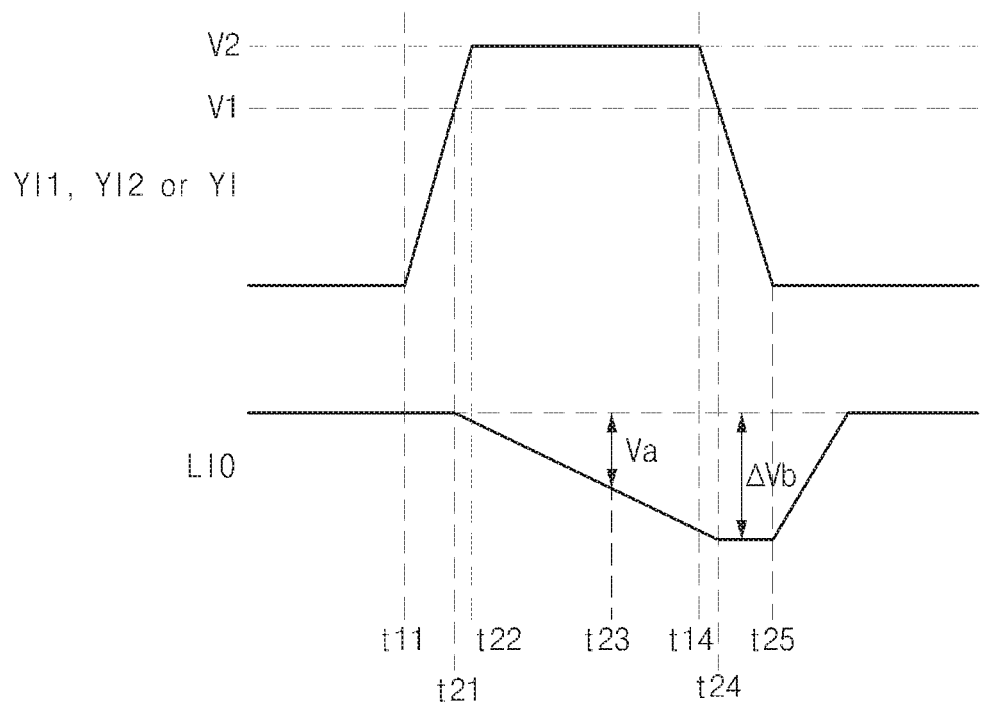

FIGS. 6A and 6B illustrate a voltage waveform of the column select signal YI1, YI2, or YI depending on the length of the column select signal transmission line CSL1, CSL2, or CSL, respectively, and a voltage waveform of the data transmission line LIO. FIG. 6A illustrates the case in which the length of the column select signal transmission line CSL1, CSL2, or CSL is larger than in FIG. 6B.

Referring to FIG. 6A, the voltage of the column select signal YI1, YI2, or YI may start to rise at time t11 and reach a voltage level V1 at time t12. The voltage of the column select signal YI1, YI2, or YI may reach a voltage level V2 at time t13, and retain the voltage level V2 during a time period from time t13 to time t14. The voltage of the column select signal YI1, YI2, or YI may start to fall at time t14, reach the voltage level V1 at time t15, and return to the initial voltage level at time t16.

In the present embodiment, the column select signal YI1, YI2, or YI needs to be retained at the voltage level V1 or more, such that the pulse-type column select signal YI1, YI2, or YI is normally recognized by the column selection circuits CSEL1 and CSEL2. Therefore, when the voltage of the column select signal YI1, YI2, or YI reaches the voltage level V1 at time t12, the voltage of the data transmission line LIO corresponding to the column select signal YI1, YI2, or YI may start to fall. The voltage of the data transmission line LIO may fall during a time period from time t12 to time t15 in which the voltage of the column select signal YI1, YI2, or YI is equal to or greater than the voltage level V1. At time t15, the magnitude of the voltage of the data transmission line LIO may have the maximum (largest displacement from the voltage of the data transmission line LIO at time t11) value corresponding to ΔVa. The voltage of the data transmission line LIO may retain the value corresponding to ΔVa for a predetermined time from timing t15, and return to the initial voltage level.

FIG. 6B illustrates that the length of the column select signal transmission line CSL1, CSL2, or CSL is smaller than illustrated for FIG. 6A. In FIG. 6B, a load caused by the column select signal transmission line CSL1, CSL2, or CSL may become smaller than in FIG. 6A. Therefore, the voltage of the column select signal YI1, YI2, or YI may have a steep increasing slope. Therefore, when the voltage of the column select signal YI1, YI2, or YI in FIG. 6B starts to rise at time t11 as in FIG. 6A, the voltage of the column select signal YI1, YI2, or YI may reach the voltage level V1 at time t21, earlier than time t12 in FIG. 6A, and reach the voltage level V2 at time t22, earlier than timing t13 in FIG. 6A.

In FIG. 6B, the column select signal YI1, YI2, or YI may start to fall at the same time as time t14 in FIG. 6A. However, the voltage of the column select signal YI1, YI2, or YI may also have a steeper decreasing slope than in FIG. 6A, in a similar manner to the rise of the voltage. Therefore, in FIG. 6B, the voltage of the column select signal YI1, YI2, or YI may reach the voltage level V1 at time t24 earlier than the time t15 in FIG. 6A, and reach the original voltage at time t25 earlier than the time t16 of FIG. 6A.

When the voltage of the column select signal YI1, YI2 or YI reaches the voltage level V1 at timing t21 of FIG. 6B, the voltage of the data transmission line LIO may start to fall. At this time, because the increasing slope of the voltage of the column select signal YI1, YI2 or YI is steeper than in FIG. 6A, the decreasing slope of the voltage of the data transmission line LIO may also be steeper than in FIG. 6A. Therefore, the magnitude of the voltage of the data transmission line LIO may reach ΔVa at time t23 earlier than time t15 of FIG. 6A. Furthermore, the voltage of the data transmission line LIO may fall during a time period from time t22 to time t24 in which the voltage of the column select signal YI1, YI2, or YI is equal to or more than the voltage level V1, and the time period from time t22 to time t24 may be longer than the time period from time t12 to time t15 in which the voltage of the column select signal YI1, YI2, or YI is equal to or more than the voltage level V1 in FIG. 6A. That is, because the voltage of the data transmission line LIO falls with a larger slope for a longer time than in FIG. 6A, the maximum value corresponding to ΔVb of the voltage of the data transmission line LIO may be larger than the maximum value corresponding to ΔVa of FIG. 6A.

When the length of the column select signal transmission line CSL1, CSL2, or CSL is reduced, the voltage of the column select signal YI1, YI2, or YI may reach the voltage level V1 earlier, which makes it possible to reduce a time tAA required until data is outputted after the column address CADD is transferred to the column decoder 410 or 420.

In FIG. 6B, it has been described that the voltage of the column select signal YI1, YI2, or YI starts to fall at the same time as FIG. 6A. In another embodiment, however, the voltage of the column select signal YI1, YI2, or YI may have the same pulse width as FIG. 6A. In this case, because the timing at which the column select signal YI1, YI2, or YI starts to fall can be advanced, the operating margin of a column-to-column delay time (tCCD) can be secured.

As described above, the level of the column select signal YI1, YI2, or YI needs to be retained at the voltage level V1 or more, such that the pulse-type column select signal YI1, YI2, or YI is normally recognized by the column selection circuits CSEL1 and CSEL2. However, as the length of the column select signal transmission line CSL1, CSL2, or CSL is increased, the slope of the pulse of the column select signal YI1, YI2, or YI may decrease. Thus, the period in which the level of the column select signal YI1, YI2, or YI is equal or to more than the predetermined voltage level V1 may be reduced. The reduction may limit the length of the column select signal transmission line CSL1, CSL2, or CSL, for example, the height of the bank.

In accordance with the present embodiment, the semiconductor device 1 may include the first and second column select signal transmission lines CSL1 and CSL2 having a shorter length than the height of the bank. The first column decoder 410 may transmit the first column select signal YI1 through the first column select signal transmission line CSL1, or the second column decoder 420 may transmit the second column select signal YI2 through the second column select signal transmission line CSL2. Therefore, the length of the transmission path of the first or second column select signal YI1 or YI2 may be reduced. Therefore, the slope of the first or second column select signal YI1 or YI2 may be increased to secure the pulse width while increasing the bank height.

Figure 7:
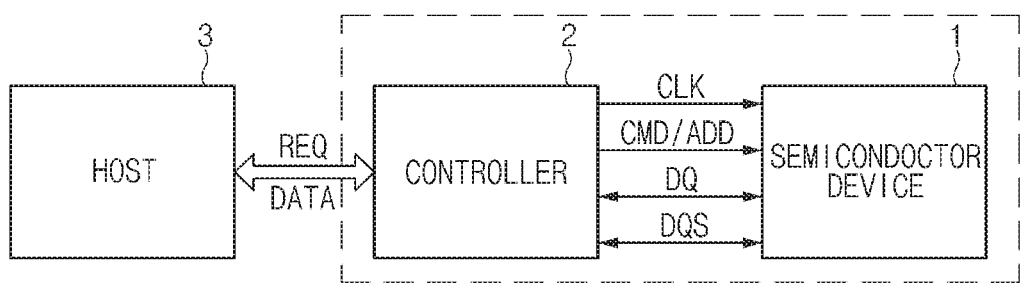
FIG. 7 illustrates the configuration of a semiconductor system including the semiconductor device of FIG. 1.

FIG. 7 illustrates a configuration of a semiconductor system 1000 including the semiconductor device 1 of FIG. 1.

As illustrated in FIG. 7, the semiconductor system 1000 may include the semiconductor device 1, a controller 2, and a host 3. The semiconductor device 1 may include a memory device such as a DRAM or flash memory. The controller 2 may include a memory controller for controlling the memory device. The semiconductor device 1 and the controller 2 may be implemented as one module as indicated by a dotted line. The host 3 may include a CPU, for example, and serve as test equipment for transmitting various commands for performing the series of operations in accordance with an embodiment.

The host 3 may transmit a request REQ and data DATA to the controller 2 to access the semiconductor device 1. The host 3 may transmit data to the controller 2 to store the data in the semiconductor device 1. Furthermore, the host 3 may receive data from the semiconductor device 1 through the controller 2. The controller 2 may provide data information, address information, memory setting information, a write request, and a read request to the semiconductor device 1 in response to the request REQ, and control the semiconductor device 1 to perform a write or read operation. The controller 2 may relay communication between the host 3 and the semiconductor device 1. The controller 2 may receive the request REQ and the data DATA from the host 3, generate a clock signal CLK, a command CMD, an address ADD, data DQ, and a data strobe signal DQS, and provide the generated signals to the semiconductor device 1, in order to control the operation of the semiconductor device 1. The address ADD may include a row address RADD and a column address CADD. The controller 2 may provide the data DQ and data storage signal DQS from the semiconductor device 1 to the host 3. FIGS. 1 and 2 do not illustrate the clock signal CLK, the command CMD, and the data strobe signal DQS, but such signals may be processed through a known technique.

In the present embodiment, the semiconductor device 1 may perform a write or read operation based on the command CMD and the address ADD. The semiconductor device 1 may enable a word line based on a result obtained by decoding the row address RADD. Furthermore, the semiconductor device 1 may enable the first or second column decoder 410 or 420 based on the row address RADD. The enabled first or second column decoder 410 or 420 may generate the first or second column select signal YI1 or YI2, respectively, based on a result obtained by decoding the column address CADD. The first column select signal YI1 may be transmitted to the column selection circuit CSEL1 and the cell MC1 through the first column select signal transmission line CSL1. The second column select signal YI2 may be transmitted to the column selection circuit CSEL2 and the cell MC2 through the second column select signal transmission line CSL2. During a read operation, the data DQ outputted from the cell MC1 or MC2 may be transmitted to the controller 2 through the data I/O line LIO and the data I/O circuit 500. During a write operation, data may be transmitted through the data I/O line LIO at the same time as the first or second column select signal YI1 or YI2 is transmitted. The transmitted data DQ may be stored in the cell MC1 or MC2.

FIG. 7 illustrates that the host 3 and the controller 2 are physically separated from each other. However, the controller 2 may be included (embedded) in processors, such as a CPU, AP and GPU of the host 3, or implemented as one chip with the processors in the form of SoC (System on Chip).

The semiconductor device 1 may receive the clock signal CLK, the command CMD, the address ADD, the data DQ, and the data strobe signal DQS from the controller 2, and may perform an operation based on the received signals.

The semiconductor device 1 may include a plurality of banks and may store the data DQ in a specific region of the bank based on the address ADD. The semiconductor device 1 may perform a data transmitting operation based on the command CMD and address ADD received from the controller 2. The semiconductor device 1 may transmit the data DQ stored in a specific region of the bank to the controller 2 based on the command CMD and the address ADD.

Embodiments have been described in detail. However, the present disclosure is not limited to the above-described embodiments and the accompanying drawings. It will be obvious to those skilled in the art that the present disclosure includes various substitutions and modifications, which can be made without departing the scope of the present disclosure.

For example, FIG. 1 illustrates that the semiconductor device 1 includes only one bank 100. However, the semiconductor device 1 may include a plurality of banks, and a column decoder selection circuit and first and second column decoders may be installed for each of the banks.

The arrangement of the components of FIG. 1 may be changed. For example, the column decoder selection circuit 300 or the data I/O circuit 500 may be arranged in different positions than as shown in FIG. 1.

For reference, additional components may be included to describe the present disclosure in more detail, even though the additional components are not directly related to the technical idea of the present disclosure. Furthermore, the configuration of an active high or active low level indicating an active state of a signal or circuit may be changed depending on embodiments. Such a circuit change may have too many cases, and can be easily inferred by those skilled in the art. Thus, the enumeration of the cases is omitted herein.

In accordance with the present embodiment, a semiconductor device can reduce the path through which the column select signal is transmitted, thereby improving the integration density of the semiconductor device.

What is claimed is:

1. A semiconductor device comprising:
   a first column decoder arranged at a first side of a bank, wherein the first column decoder is enabled by a first column decoder select signal;
   a second column decoder arranged at a second side of the bank, wherein the second column decoder is enabled by a second column decoder select signal, and wherein the bank is arranged between the first column decoder and the second column decoder; and
   a column decoder selection circuit suitable for activating any one of the first column decoder select signal and the second column decoder select signal based on a row address.

2. The semiconductor device of claim 1 further comprising:
   a first column select signal transmission line coupled to the first column decoder, wherein the first column select signal is suitable for transmitting a first column select signal to the bank; and
   a second column select signal transmission line coupled to the second column decoder, wherein the second column select signal is suitable for transmitting a second column select signal to the bank.

3. The semiconductor device of claim 2, wherein the first and second column select signal transmission lines each have a length shorter than the height of the bank.

4. The semiconductor device of claim 2, wherein the first and second column select signal transmission lines each have a length half of the height of the bank.

5. The semiconductor device of claim 1, wherein the first column decoder outputs a first column select signal to an upper region of the bank based on a result obtained by decoding a column address.

6. The semiconductor device of claim 1, wherein the second column decoder outputs a second column select signal to a lower region of the bank based on a result obtained by decoding a column address.

7. The semiconductor device of claim 1 further comprising a data input and output (I/O) circuit arranged adjacent to the second column decoder, wherein the second column decoder is arranged between the bank and the I/O circuit, and wherein the I/O circuit is suitable for transmitting data inputted from outside to a data I/O line or outputting data transmitted through the data I/O line to the outside.

8. The semiconductor device of claim 7, wherein the data I/O line corresponds to a bit line of the bank, and wherein the data I/O line is coupled to the data I/O circuit.

9. The semiconductor device of claim 8, wherein the data I/O line has the same length as the height of the bank.

10. The semiconductor device of claim 1, wherein the bank comprises:
    a first column selection circuit coupled between a data I/O line and a bit line, wherein the first column selection circuit has a gate terminal coupled to a first column select signal transmission line of the first column decoder, wherein the first column select signal transmission line transmits the first column decoder select signal; and
    a second column selection circuit coupled between the data I/O line and the bit line, second column selection circuit has a gate terminal coupled to a second column select signal transmission line of the second column decoder, wherein the second column select signal transmission line transmits the second column decoder select signal.

11. The semiconductor device of claim 1, wherein the column decoder selection circuit enables any one of the first and second column decoders based on a most significant bit (MSB) of the row address.

12. A semiconductor device comprising:
    a column decoder selection circuit suitable for activating any one of a first column decoder select signal and a second column decoder select signal based on a row address;
    a first column decoder suitable for decoding a column address based on the first column decoder select signal, and for outputting a first column select signal to a first column select signal transmission line based on the decoding result of the column address;
    a second column decoder suitable for decoding the column address based on the second column decoder select signal, and for outputting a second column select signal to a second column select signal transmission line based on the decoding result of the column address; and
    a bank comprising a plurality of cells coupled to a plurality of word lines and a plurality of bit lines, wherein cells of the plurality of cells in an upper region of the bank are accessed in response to a first column select signal transmitted through the first column select signal transmission line, and wherein cells of plurality of cells in a lower region of the bank are accessed in response to a second column select signal transmitted through the second column select signal transmission line.

13. The semiconductor device of claim 12, wherein the first column decoder is arranged at a first side of the bank, and a second column decoder is arranged at a second side of the bank, wherein the bank is arranged between the first and second column decoders, and wherein the plurality of bit lines extend through the bank between the first and second sides of the bank.

14. The semiconductor device of claim 12, wherein the first and second column select signal transmission lines each have a length shorter than the height of the bank.

15. The semiconductor device of claim 12, wherein the first and second column select signal transmission lines each have a length half of the height of the bank.

16. The semiconductor device of claim 12, further comprising a data input and output (I/O) circuit arranged adjacent to the second column decoder, wherein the second column decoder is arranged between the bank and the I/O circuit.

17. The semiconductor device of claim 16, wherein the data I/O line corresponds to a bit line of the bank, and wherein the data I/O line is coupled to the data I/O circuit.

18. The semiconductor device of claim 17, wherein the data I/O line has the same length as the height of the bank.

19. The semiconductor device of claim 17, wherein the bank comprises:
    a first column selection circuit coupled between the data I/O line and a bit line of the plurality of bit lines, wherein the first column selection circuit has a gate terminal coupled to the first column select signal transmission line; and a second column selection circuit coupled between the data I/O line and the bit line, wherein the second column selection circuit has a gate terminal coupled to the second column select signal transmission line.

20. The semiconductor device of claim 12, wherein the column decoder selection circuit activates any one of the first and second column decoder select signals based on a most significant bit (MSB) of the row address.

* * * * *